United States Patent
Iijima et al.

(10) Patent No.: US 8,288,286 B2
(45) Date of Patent: Oct. 16, 2012

(54) DRY-ETCHING METHOD

(75) Inventors: Etsuo Iijima, Yamanashi (JP); Norikazu Yamada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 683 days.

(21) Appl. No.: 12/335,872

(22) Filed: Dec. 16, 2008

(65) Prior Publication Data

US 2009/0098736 A1    Apr. 16, 2009

Related U.S. Application Data

(63) Continuation of application No. 10/480,821, filed as application No. PCT/JP02/05637 on Jun. 7, 2002, now Pat. No. 7,476,624.

(30) Foreign Application Priority Data

Jun. 15, 2001 (JP) .................................. 2001-182193
Oct. 17, 2001 (JP) .................................. 2001-319755

(51) Int. Cl.
    *H01L 21/302* (2006.01)
(52) U.S. Cl. .... 438/714; 438/706; 438/710; 156/345.48
(58) Field of Classification Search .................. 438/706, 438/710, 712, 714, 720; 156/345.44, 45, 156/345.47, 48; 216/67, 71
    See application file for complete search history.

(56) References Cited

U.S. PATENT DOCUMENTS

| 4,380,488 A * | 4/1983 | Reichelderfer et al. ........ 216/71 |
| 4,812,712 A * | 3/1989 | Ohnishi et al. ................ 315/176 |
| 5,160,407 A | 11/1992 | Latchford et al. |
| 5,665,203 A | 9/1997 | Lee et al. |
| 5,869,402 A | 2/1999 | Harafuji et al. |
| 5,994,234 A | 11/1999 | Ouchi |
| 6,010,829 A | 1/2000 | Rogers et al. |
| 6,074,538 A * | 6/2000 | Ohmi et al. ............... 204/298.06 |
| 6,081,334 A | 6/2000 | Grimbergen et al. |
| 6,103,631 A | 8/2000 | Soda et al. |
| 6,136,211 A | 10/2000 | Qian et al. |
| 6,159,860 A | 12/2000 | Yang et al. |
| 6,277,716 B1 | 8/2001 | Chhagan et al. |
| 6,283,131 B1 | 9/2001 | Chen et al. |
| 6,362,111 B1 | 3/2002 | Laaksonen et al. |
| 6,406,924 B1 | 6/2002 | Grimbergen et al. |
| 6,541,388 B1 | 4/2003 | Saito |

FOREIGN PATENT DOCUMENTS

| JP | 05-299390 | 11/1993 |
| JP | 8-64585 | 3/1996 |
| JP | 10-172959 | 6/1998 |
| JP | 10-275799 | 10/1998 |
| JP | 2001-85388 | 3/2001 |
| WO | 99/25015 | 5/1999 |

* cited by examiner

*Primary Examiner* — Lan Vinh
(74) *Attorney, Agent, or Firm* — Oblon, Spivak, McClelland, Maier & Neustadt, L.L.P.

(57) ABSTRACT

A main etching step is effected in a state shown in FIG. 1A under a first pressure using a gas containing at least HBr, e.g., a mixture gas of HBr and $Cl_2$ as an etching gas. The main etching is ended before a silicon oxide film 102, as shown in FIG. 1B, is exposed. An over-etching process is effected under a second pressure higher than the first pressure using a gas containing at least HBr, e.g., an HBr single gas so as to completely expose the silicon oxide film 102 as shown in FIG. 1C. In such a way, the selectivity of a silicon-containing conductive layer with respect to the silicon oxide film is improved compared to conventional methods. Without etching the silicon oxide film layer, which is an underlying layer, and without marring the shape of the silicon-containing conductive film layer formed by etching, only the desired silicon-containing conductive film layer is removed by etching reliably.

15 Claims, 6 Drawing Sheets

DRY-ETCHING METHOD

This application is a Continuation Application of U.S. application Ser. No. 10/480,821, filed on Dec. 15, 2003, now allowed, the entire disclosure of which is incorporated herein by reference.

FIELD OF THE INVENTION

The present invention relates to a dry etching method for use in manufacturing a semiconductor device; and, more particularly, to a dry etching method for etching a silicon-containing conductive film layer formed on a silicon oxide film layer.

BACKGROUND OF THE INVENTION

To conventionally fabricate, e.g., a gate structure in a manufacturing process of a semiconductor device, a conductor layer [a silicon-containing conductive film layer (e.g., a polysilicon layer, a silicide layer, or a polysilicon layer and a silicide layer deposited thereon)] is formed on an insulating layer of a silicon oxide film layer. Thereafter, the conductor layer is etched into a predetermined pattern through a mask layer formed thereon until the underlying silicon oxide film layer is exposed.

Conventionally, a plasma etching has been widely employed for etching such a silicon-containing conductive film layer formed on the silicon oxide film layer.

When plasma etching the silicon-conductive film layer, the etching is further carried out even after the silicon oxide film layer is exposed, i.e., a so-called overetching is performed, in order to completely remove undesired portions of the silicon-containing conductive film layer from every part on the entire surface of, e.g., a semiconductor wafer.

In such an overetching process, the etching should be applied only to the silicon-containing conductive film layer, not to the exposed silicon oxide film. For this reason, an etching gas for use in the overetching process is required to have a high selectivity of the silicon-containing conductive film against the silicon oxide film (an etching rate of the silicon-containing conductive layer to that of the silicon oxide film). Conventionally, an HBr gas or a mixture gas of HBr and $O_2$ gases has been employed as the etching gas. Further, a pressure during the etching is typically set to be about 0.67 to about 6.7 Pa.

However, circuit patterns of semiconductor devices are getting miniaturized recently. For example, there is a trend for favoring a thinner thickness of the silicon oxide film layer in the above-described gate structure.

Therefore, there is an ever increasing demand for enhancement of a fabrication precision in forming a circuit pattern. In the etching process described above, it is also required to further increase the selectivity of the silicon-containing conductive film layer against the silicon oxide film such that only the desired portions of the silicon-containing containing conductive film layer can be etched to be removed, without etching the silicon oxide film layer serving as a base layer and without spoiling the etched shape of the silicon-containing conductive film layer.

SUMMARY OF THE INVENTION

It is, therefore, an object of the present invention to provide a dry etching method capable of increasing a selectivity of a silicon-containing conductive film against a silicon oxide film such that only desired silicon-containing conductive film layer can be etched to be completely removed while a silicon oxide film layer, i.e., a base layer, is prevented from being etched and an etched shape of the silicon-containing conductive film layer is prevented from being degraded.

In accordance with the present invention, there is provided a dry etching method for etching a silicon-containing conductive film layer formed on a silicon oxide film layer through a mask layer of a predetermined pattern shape formed on the silicon-containing conductive film layer by using an etching gas containing at least an HBr gas, wherein the method includes a main plasma etching process performed under a first pressure lower than 13 Pa and a plasma overetching process performed after the main etching process under a second pressure ranging from 13 Pa to 27 Pa, which is higher than that of the main etching process.

Further, the silicon-containing conductive film layer of the dry etching method of the present invention may be a polysilicon layer.

Furthermore, the silicon-containing conductive film layer of the dry etching method of the present invention may be a silicide layer.

Still further, the silicon-containing conductive film layer of the dry etching method of the present invention may be a polysilicon layer and a silicide layer deposited thereon. Further, the etching gas in the overetching process of the present invention may be a mixture gas of HBr and $O_2$ or the HBr gas.

Moreover, the etching gas used in the main etching process of the dry etching method of the present invention may be a mixture gas of $HBr+Cl_2$, $HBr+Cl_2+O_2$, $Cl_2+O_2$, or $HBr+O_2$, or the HBr gas.

Further, the overetching process of the dry etching method of the present invention may include a first overetching process and a second overetching process following the first overetching process.

Still further, in accordance with the dry etching method of the present invention, a pressure in the second overetching process may be set to be higher than that in the first overetching process.

Still further, the main etching process of the dry etching method of the present invention is terminated before the silicon oxide film layer underlying the silicon-containing conductive film layer is exposed by detecting an etching state of the silicon-containing conductive film layer.

In accordance with the present invention, there is further provided a dry etching method for etching a silicon-containing conductive film layer formed on a silicon oxide film layer through a mask layer of a predetermined pattern shape formed on the silicon-containing conductive film layer by using an etching gas containing at least an HBr gas, wherein the etching gas contains $O_2$ of 1 to 15 percent by volume.

Preferably, the etching gas may contain $O_2$ of 3 to 5% by volume.

DETAILED DESCRIPTION OF PREFERRED EMBODIMENTS

A preferred embodiment of the present invention will now be described hereinafter with reference to the accompanying drawings.

Figure 1A:
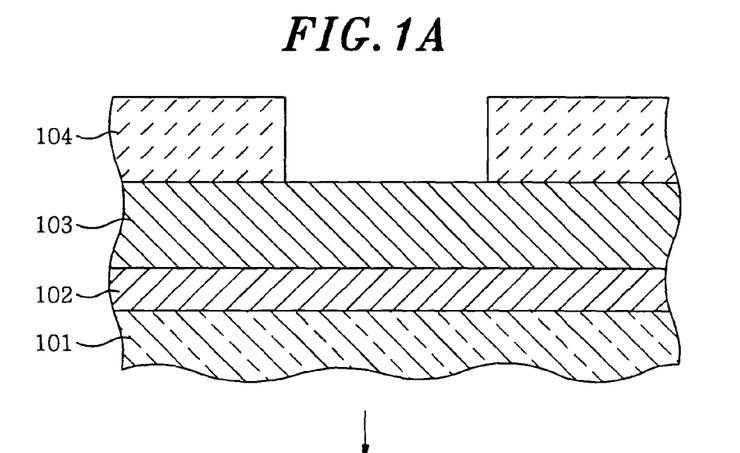
FIGS. 1A to 1C provide schematic cross sectional views of a wafer explaining a preferred embodiment of the present invention.
Figure 1B:
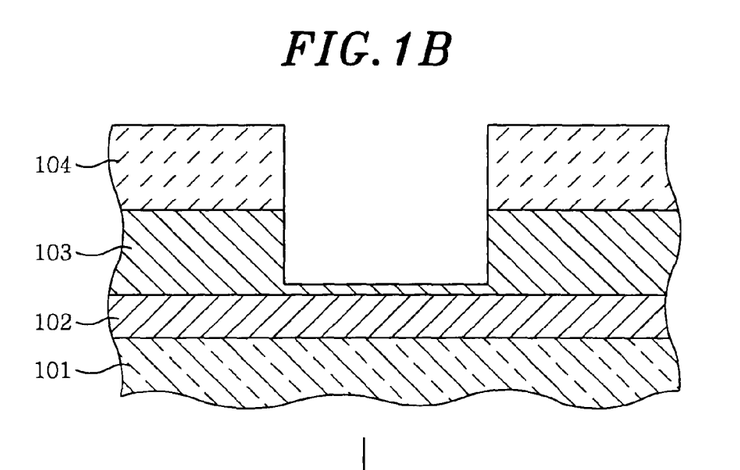
Figure 1C:
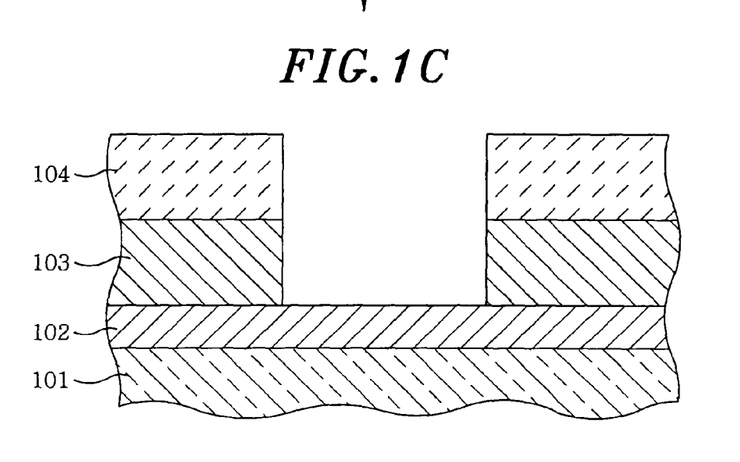

Referring to FIGS. 1A to 1C, there are illustrated partially enlarged schematic longitudinal cross sectional views of a semiconductor wafer (silicon substrate) for explaining the preferred embodiment of the present invention.

As shown in FIG. 1A, formed on the semiconductor wafer (silicon substrate) 101 are a silicon oxide film layer 102 forming an insulating layer and a silicon-containing conductive film layer 103 forming a conductor layer (e.g., a polysilicon layer, a silicide layer, or a polysilicon layer and a silicide layer disposed thereon).

Further, formed on the silicon-containing conductive film layer 103 is a mask layer 104 made of a photoresist or a so-called hard mask (silicon nitride, for example) and having a predetermined pattern.

In this preferred embodiment, the silicon-containing conductive film layer 103 is etched through the mask layer 104 into a predetermined pattern.

Figure 2:
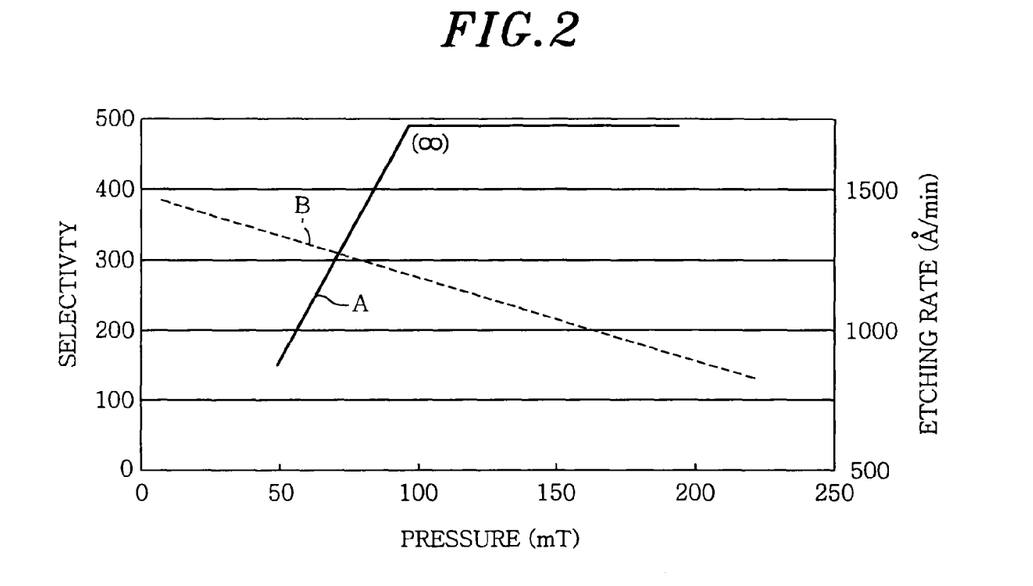
FIG. 2 describes a graph showing a relationship between a pressure and an etching rate and that between a pressure and a selectivity.

FIG. 2 is a graph showing a relationship between a pressure of an HBr gas serving as an etching gas and a selectivity of polysilicon against a silicon oxide film (an etching rate of the polysilicon/an etching rate of the silicon oxide film) (solid line A) and that between the pressure of the HBr gas and an etching rate of the polysilicon (dashed line B), wherein a horizontal axis represents the pressure of the HBr gas while vertical axes stand for the selectivity and the polysilicon etching rate, respectively.

In case of employing the HBr gas as the etching gas, the etching rate of the polysilicon decreases almost linearly as the pressure of HBr gas increases, as shown by the dashed line B in FIG. 2.

Meanwhile, the selectivity increases as the pressure of HBr gas increases as illustrated by the solid line A and finally becomes virtually infinite at a pressure of about 13 Pa (100 mTorr). The virtual infinity in the selectivity means that virtually no etching takes place in the silicon oxide film.

That is, in case of using HBr (HBr+$O_2$ yielding similar effects) as the etching gas, the selectivity of the polysilicon against the silicon oxide film can be increased virtually up to infinity by maintaining the pressure at about 13 Pa (100 mTorr) or more. Herein, such an increase in the selectivity is considered due to a deposition of $SiO_2$, SiBr and the like and a reduction in a sputtering power, which is caused by a reduction in the relative number of ions over radicals resulting from a rise in a molecular density.

On the other hand, if the pressure is set to be lower than 13 Pa, the etching rate of the polysilicon can be raised though the selectivity is reduced.

Therefore, in the preferred embodiment of the present invention, the pressure of the etching gas is increased in an overetching process where a selectivity is required to be as high as possible. On the other hand, in the so-called main etching process, etching is carried out at a pressure level lower than that in the overetching process (i.e., under a condition where the selectivity is low but the etching rate is high) since in the main etching process, a high etching rate is required rather than a high selectivity.

Further, in case the HBr gas is employed as the etching gas, the etching rate of the polysilicon decreases almost linearly as the pressure increases, as indicated by the dashed line B shown in FIG. 2 since the etching is restrained due to a deposition when the pressure is increased.

A thickness of the silicon-containing conductive film layer 103 typically ranges from 100 to 150 nm (1000 to 1500 Å) and the overetching process is carried out for 100% etching (i.e., corresponding to etching of 100 to 150 nm) Thus, in case of executing the main etching for about 1 minute and then the overetching for within 2 minutes, it is preferable to perform the overetching process at a pressure of 27 Pa (200 Torr) or less in order to obtain an etching rate equal to or higher than about 90 nm/min (900 Å/min).

Furthermore, if a gas containing $Cl_2$ is employed in the above overetching process, it becomes difficult to attain a high enough selectivity for overetching process. Thus, in case the thickness of the silicon oxide film layer 102 is thin and a high selectivity is required, it is preferable to use an HBr gas or a mixture gas of HBr and $O_2$ as the etching gas, not the gas containing $Cl_2$.

A detailed etching process will now be described. First, the main etching process is conducted at a pressure of about 6.7 Pa (50 mTorr) in a state shown in FIG. 1A wherein employed as an etching gas is a gas containing at least HBr, e.g., a mixture gas of HBr+$Cl_2$+$O_2$, HBr+$Cl_2$, $Cl_2$+$O_2$ or HBr+$O_2$.

Thereafter, when most of the silicon-containing conductive film layer 103 is etched but the underlying silicon oxide film layer 102 is not exposed yet as shown in FIG. 1B, the main etching process is terminated and an overetching process is started.

In the preferred embodiment, the overetching process is divided into a first overetching process and a second overetching process, wherein the second overetching process is conducted under a condition with a selectivity higher than that in the first overetching process.

In general, an overetching in a typical overetching process is performed for a predetermined time period even after the silicon oxide film layer 102 located below certain regions on the wafer W is mostly exposed as shown in FIG. 1C. Since the etching rate varies depending on positions on the wafer and pattern shapes, extending the overetching time period is needed to make it sure that all the undesired portions of the silicon-containing conductive film layer 103 are completely removed from the entire region of the wafer.

However, in such an overetching process as described above, the selectivity should be further increased since the underlying silicon oxide film layer 102 is mostly exposed.

For this reason, in the preferred embodiment of the present invention, the overetching process is divided into the first overetching process having a relatively high selectivity as well as a relatively high etching rate and the second overetching process featuring a selectivity even higher than that of the first overetching process.

The first overetching process can be switched to the second overetching process by increasing the pressure of the second overetching process to be higher than that of the first overetching process, changing an etching gas species, varying a bias voltage applied to the wafer, modifying a distance between electrodes or by a combination thereof.

Next, a method for detecting a timing for switching from the main etching process to the overetching process will now be explained.

Conventionally, an end point of an etching is detected by the temporal variation in the light intensity from the material being etched obtained by measuring and detecting a temporal variation of the intensity of light of a certain wavelength in plasma.

Figure 3:
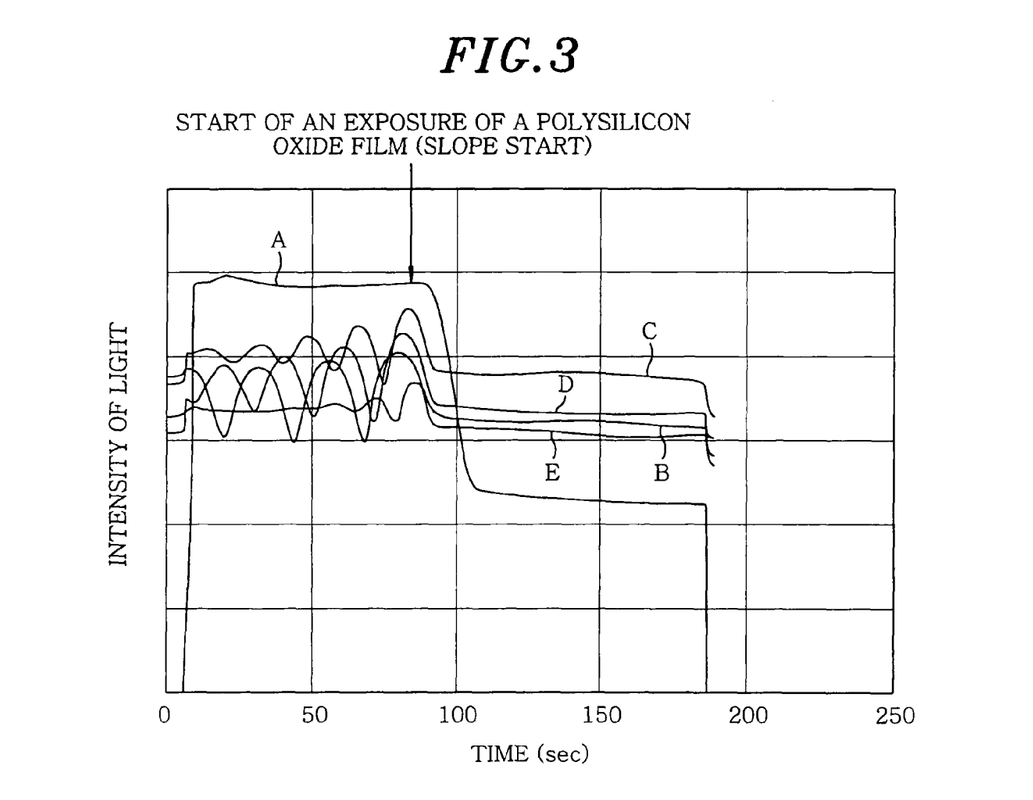
FIG. 3 depicts a graph explaining an end point detection method for use in the embodiment of the present invention.

Curve A in FIG. 3 shows a variation in the intensity of light of a specific wavelength (e.g., 405 nm) caused by the etching of polysilicon. As shown, the intensity of the light is maintained at a substantially constant level during the etching of the polysilicon layer. However, the intensity of the light starts to decrease when the base layer begins to be partially exposed as the polysilicon layer being removed. If the exposure of the base layer is nearly completed, the intensity of light becomes substantially constant at a reduced level. Thus, the end point of etching can be detected by observing such variation in the intensity of light.

Since, however, a change in the intensity of light occurs when the base layer begins to be exposed in the above-mentioned etching end point detection method, it is impossible to stop the main etching before the base layer begins to be exposed. Therefore, in the preferred embodiment, a reduction in the thickness of the silicon-containing conductive film layer 103 is detected by an apparatus configured as shown in FIG. 4 to thereby detect the end point of the main etching before the base layer begins to be exposed by thinning of the silicon-containing conductive film layer 103 as shown in FIG. 1B.

Figure 4:
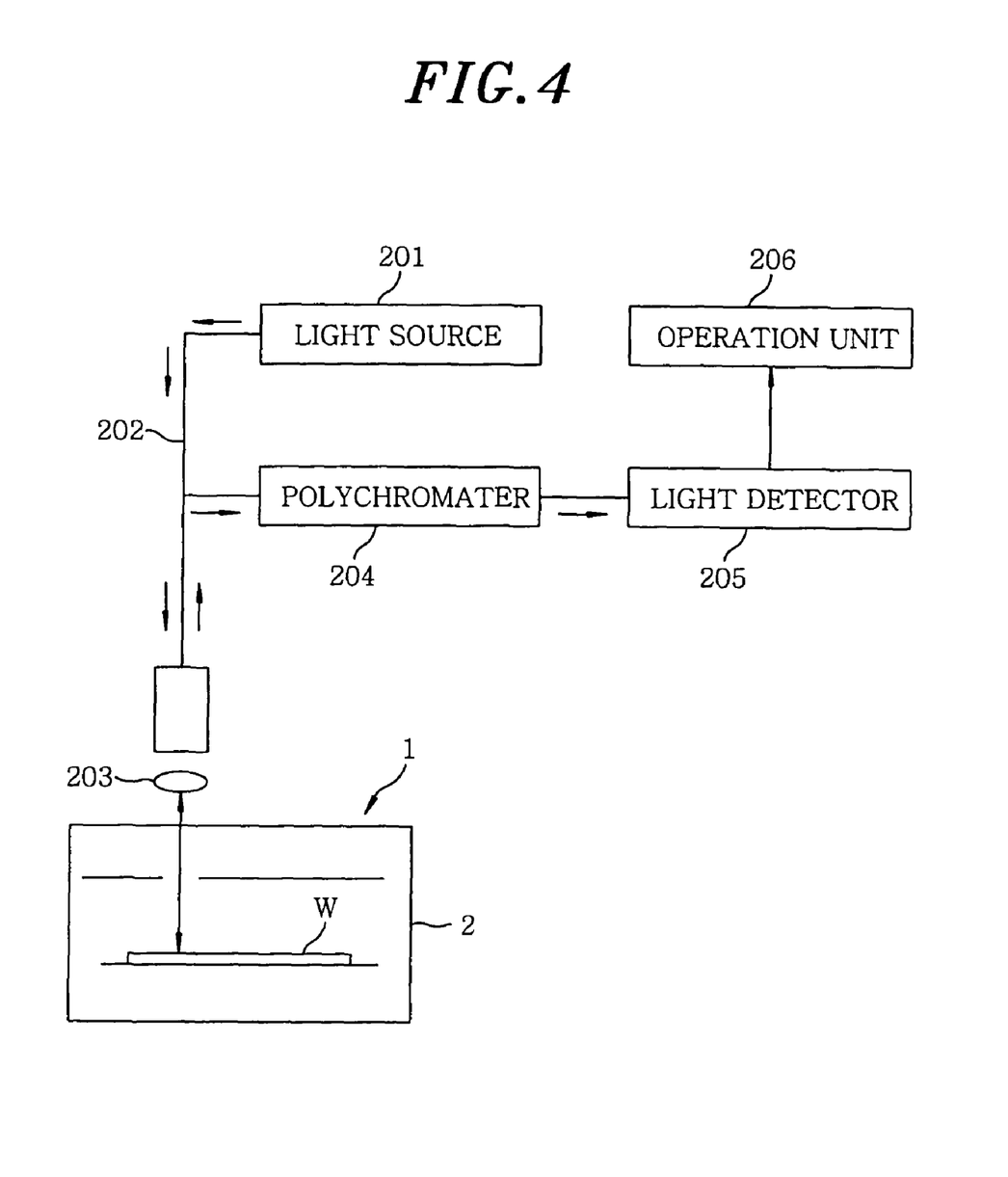
FIG. 4 exemplifies a structure of an end point detecting apparatus for use in the embodiment of the present invention.

In the apparatus shown in FIG. 4, light (having a wavelength of, e.g., 400 to 800 nm) from a light source 201 is eradiated onto the surface of a wafer W mounted in a chamber 2 of an etching apparatus 1 via an optical fiber 202 and a lens 203. Then, reflected light is detected by a polychrometor 204 and a light detector 205. Output signals from the light detector 205 are processed by an operation unit 206.

The intensity of the light detected by the light detector 205 varies, for example, as shown by a curve B (wavelength of 400.25 nm), a curve C (wavelength of 450.08 nm), a curve D (wavelength of 499.73 nm) or a curve E (wavelength of 549.95 nm) of FIG. 3. That is, interference occurs between the light reflected from the surface of the silicon-containing conductive film layer and the light reflected from an interface between the silicon-containing conductive film layer and the underlying silicon oxide film layer. The intensity of the interference light periodically changes as the thickness of the silicon-conductive film layer decreases by etching.

Therefore, it is possible to stop the main etching before the underlying silicon oxide film layer begins to be exposed by way of investigating in advance a correlation between variations of the light intensity based on the interference light shown by the curves B to E and a variation shown by the curve A and then detecting a reduction in the amount of residual silicon-containing conductive film layer, wherein the detection of the reduction in the amount of the residual silicon-containing conductive film layer is achieved by examining the number and the point of peaks and light intensities based on, for example, either one of the curves B to E, a signal obtained by adding outputs of these curves or a differential signal thereof. In the example depicted in FIG. 3, the main etching can be stopped before the curve A starts to be reduced, i.e., before the silicon oxide film layer begins to be exposed, by detecting a last peak of the curve C.

By stopping the main etching process and switching to the overetching process before the silicon oxide film layer begins to be exposed, it is possible to etch only the silicon-containing conductive film layer without damaging the silicon oxide film.

Figure 5:
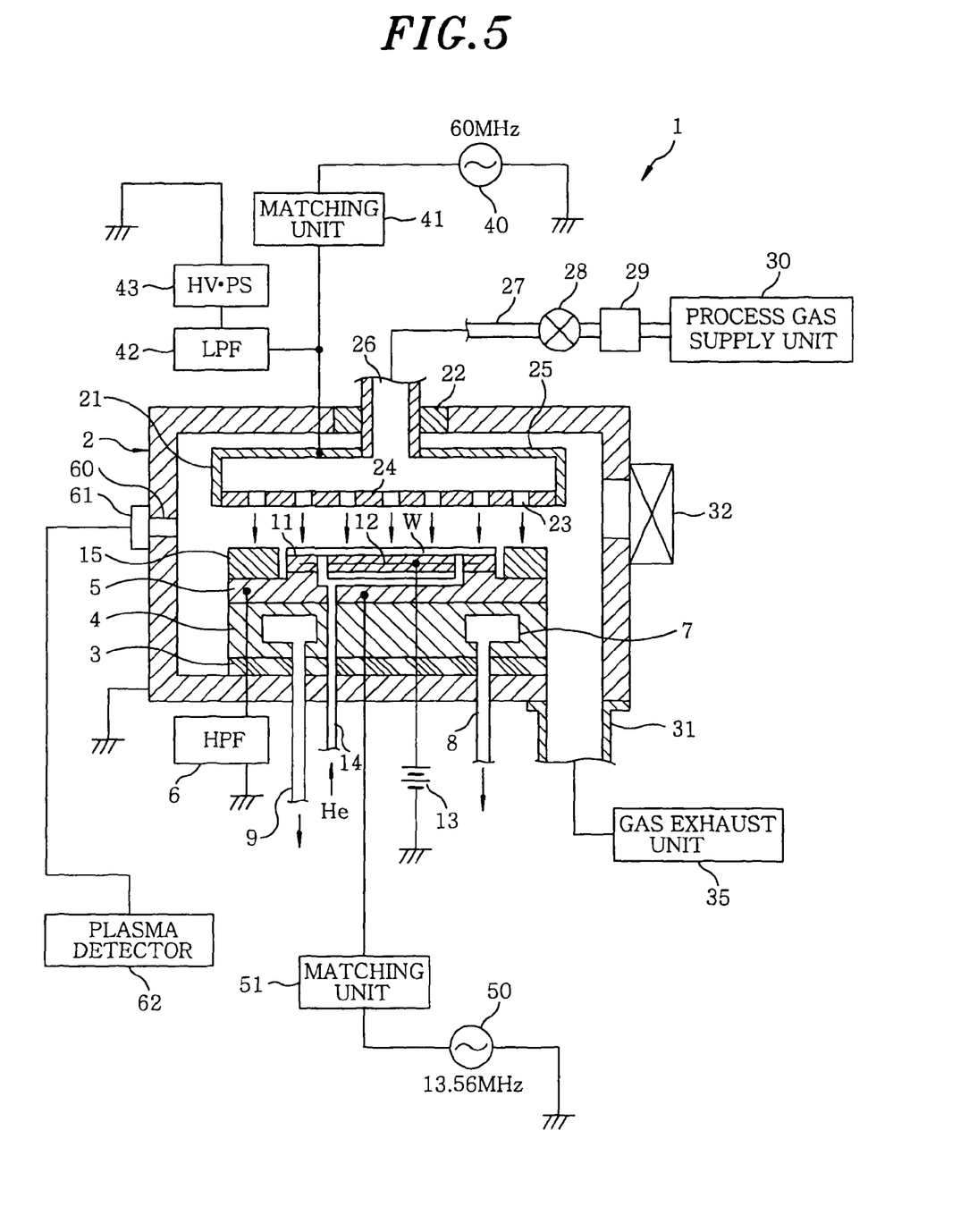
FIG. 5 illustrates a plasma processing apparatus for use in the embodiment of the present invention.

FIG. 5 illustrates an exemplary plasma processing apparatus 1 for use in the preferred embodiment of the present invention. As shown therein, the plasma processing apparatus 1 is a capacitively coupled parallel plate type etching apparatus having an upper and a lower electrode plate placed parallel to each other and respectively connected to high frequency power supplies.

The etching apparatus 1 includes, for example, a cylindrical chamber 2 which is grounded and made of aluminum whose surface is alumite treated (anodization).

Installed on a bottom portion of the chamber 2 via an insulating plate 3 such as ceramic is a substantially columnar susceptor support 4 for mounting thereon a wafer W. Mounted on the susceptor support 4 is a susceptor 5 serving as a lower electrode. Connected to the susceptor 5 is a high pass filter ("HPF") 6.

Prepared within the susceptor support 4 is a temperature control medium path 7. A temperature control medium is introduced into the temperature control medium path 7 via an inlet line 8 and is circulated therethrough to maintain the temperature of the susceptor 5 at a desired level.

The susceptor 5 is of a circular disk shape with a central topmost portion being protruded higher than a peripheral portion thereof. Mounted on the central topmost portion of the susceptor is an electrostatic chuck 11 shaped similar to the wafer W. The electrostatic chuck 11 includes an electrode 12 embedded in an insulting material. The electrostatic chuck 11 adsorbs the wafer W electrostatically by a Coulombic force generated by, e.g., a DC voltage of 1.5 kV supplied from a DC power supply 13 coupled to the electrode 12.

Further, formed through the insulating plate 3, the susceptor support 4, the susceptor 5 and the electrostatic chuck 11 is a gas channel 14 for supplying a heat transfer medium, e.g., He gas, to a backside of the wafer W to be processed. Heat is transferred between the susceptor 5 and the wafer W through the heat transfer medium, so that the wafer W is maintained at a predetermined temperature.

An annular focus ring 15 is disposed on an upper edge of the susceptor 5 to surround the wafer W mounted on the electrostatic chuck 11. The focus ring 15 is made of an insulating material, e.g., ceramic or quartz, or a conductive material, and serves to improve a uniformity of etching.

Further, installed above the susceptor 5 facing thereto in parallel is an upper electrode 21. The upper electrode 21 is supported within the chamber 2 via an insulating member 22. The upper electrode 21 includes an electrode plate 24 (made of, for example, quartz) having a plurality of injection openings 23 and an electrode support 25 that serves to support the electrode plate 24 and is made of a conductive material (for example, aluminum whose surface is alumite treated). The distance between the susceptor 5 and the upper electrode 21 is adjustable.

Formed at a center of the electrode support 25 of the upper electrode 21 is a gas inlet opening 26 communicating with a gas supply line 27, which in turn is connected to a process gas supply unit 30 via a valve 28 and a mass flow controller 29. An etching gas for plasma etching is supplied from the process gas supply unit 30. Though there is shown in FIG. 5 only one process gas supplying system comprised of the process gas supply unit 30 and the like, the plasma processing apparatus is provided with a plurality of process gas supplying systems capable of supplying for example HBr gas, $Cl_2$ gas, $O_2$ gas, and the like, into the chamber 2 by individually controlling flow rates thereof.

Connected to a bottom portion of the chamber 2 is a gas exhaust line 31, which in turn is coupled to a gas exhaust unit 35. The gas exhaust unit 35 includes a vacuum pump such as a turbo molecular pump, or the like, and serves to reduce an inner pressure of the chamber 2 down to a predetermined vacuum level, e.g., 0.67 Pa (5 mTorr) or less.

Further, installed on a sidewall of the chamber 2 is a gate value 32. The wafer W is transferred between the chamber 2 and an adjacent load lock chamber (not shown, while the gate valve 32 is open.

Connected to the upper electrode 21 via a matching unit 41 is a first high frequency power supply 40. Further connected to the upper electrode 21 is a low pass filter (LPF) 42. The first high frequency power supply 40 is of a frequency ranging from 50 to 150 MHz. By applying a high frequency power in such a range, a high-density plasma in a desired dissociation state can be generated within the chamber 2, which makes it possible to execute a plasma process under a pressure lower than that in conventional cases. It is preferred to have the frequency of the first high frequency power supply 40 in the range from 50 to 80 MHz. Typically, its frequency is 60 MHz as illustrated in FIG. 5 or thereabouts.

Figure 6:
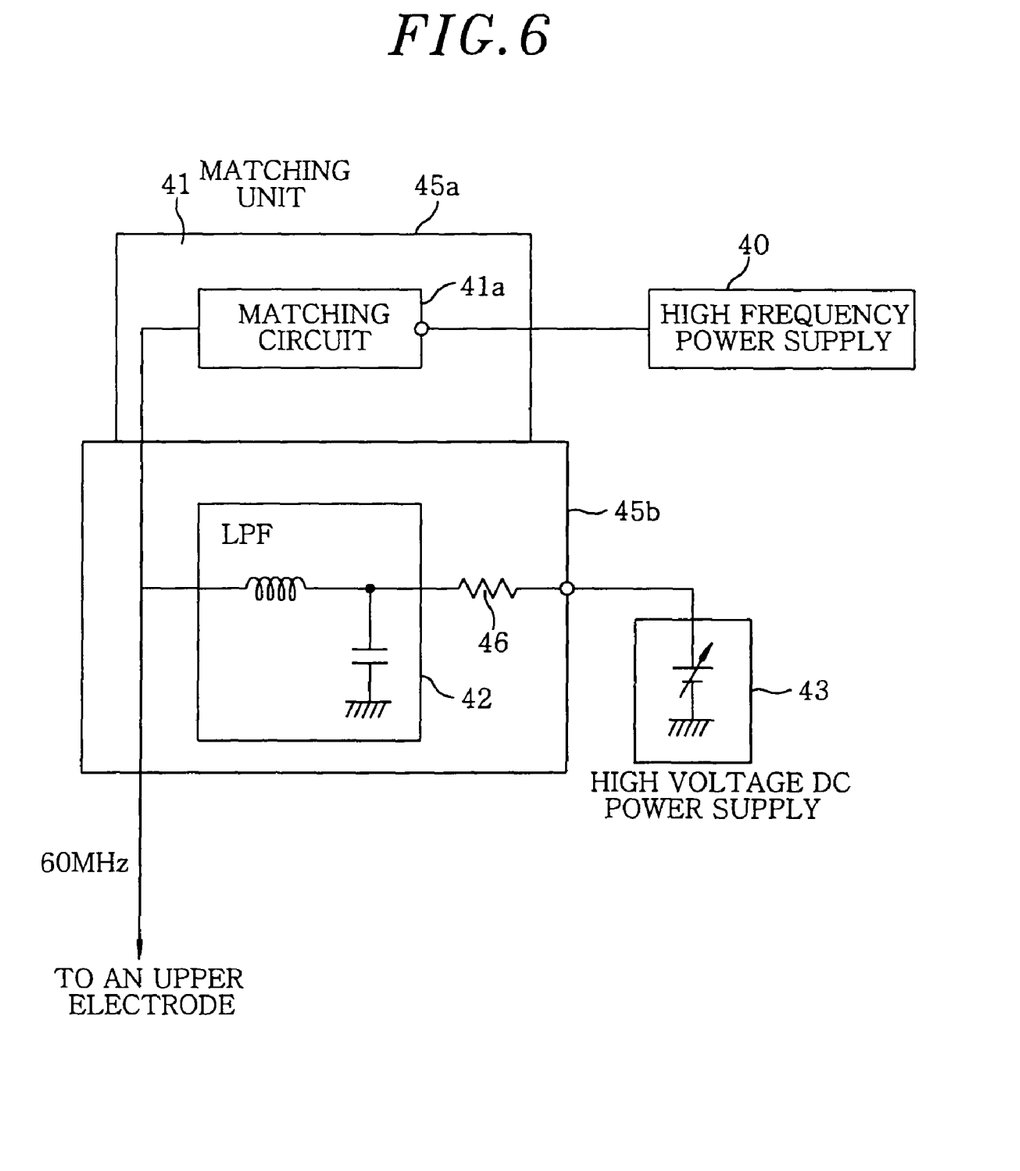
FIG. 6 is a schematic view showing main parts of the plasma processing apparatus shown in FIG. 5.

The matching unit 41 includes a matching, circuit 41a as shown in FIG. 6. The matching circuit 41a and the low pass filter (LPF) 42 are accommodated in shield boxes 45a and 45b, respectively, prepared at an upper portion of the vacuum chamber 2. Connected to the low pass filter (LPF) 42 via a resistance 46 is a high voltage DC power supply (HV-PS) 43 for applying a high DC voltage to the upper electrode 21. The HV-PS 43 applies a high DC voltage of, e.g., about 1.5 kV and the resistance 46 serves to prevent an excessive current flow therefrom.

Further, connected to the susceptor 5 serving as the lower electrode via a matching unit 51 is a second high frequency power supply 50. A frequency of the second high frequency power supply 50 ranges from several hundred Hz to less than twenty MHz. By applying a power of a frequency in such a range, a proper ionic action can be facilitated without causing any damage on the wafer W to be processed. Typically, the frequency of the second high frequency power supply 50 is 13.56 MHz as shown in FIG. 5 or 800 KHz, and so on.

Further, formed at a sidewall of the chamber 2 is a window 60 through which light from plasma generated within the vacuum chamber 2 is outputted. At an exterior of the window 60, there is disposed a light detector 61 made of a photodiode, or the like. By inputting a light detection signal detected by the light detector 61 to a plasma detector 62, it can be detected whether the plasma is ignited within the vacuum chamber 2.

An overall operation of each part in the etching apparatus 1 configured as described above is controlled by a controller (not shown).

In the following, there will be explained an etching process for etching the silicon-containing conductive film layer 103 formed on the wafer W into a predetermined pattern through the mask layer 104 by employing the plasma processing apparatus 1 configured as described above.

First, the gate valve 32 is opened and then the wafer W, on which the silicon oxide film layer 102, the silicon-containing conductive film layer 103 and the patterned mask layer 104 are formed, is carried by a transfer arm (not shown) or the like, into the chamber 2 from the load lock chamber (not shown) to be mounted on the electrostatic chuck 11.

Then, the transfer arm is withdrawn from the vacuum chamber 2 and the gate valve 32 is closed, so that the vacuum chamber 2 is hermetically sealed. At this stage, a high DC voltage from the DC power supply 13 is not yet applied to the electrostatic chuck 11.

Thereafter, the vacuum chamber 2 is evacuated to a predetermined vacuum level by the gas exhaust unit 35 and, then, the valve 28 is opened. Concurrently, an etching gas for the main etching (for example, $HBr+Cl_2$, $HBr+Cl_2+O_2$, $Cl_2+O_2$, $HBr+O_2$, or HBr) is supplied from the process gas supply unit 30 onto the wafer W, wherein the etching gas, a flow rate of which is controlled by the mass flow controller 29, is discharged uniformly towards the wafer W as indicated by arrows in FIG. 5 via the process gas supply line 27, the gas inlet opening 26, a hollow central space of the upper electrode 21 and the injection openings 23 of the electrode plate 24.

At the same time, the inner pressure of the chamber 2 is maintained at a given pressure level of, e.g., about 0.67 to 6.7 Pa.

In this state, plasma ignition is performed in a sequence as follows.

Figure 7:
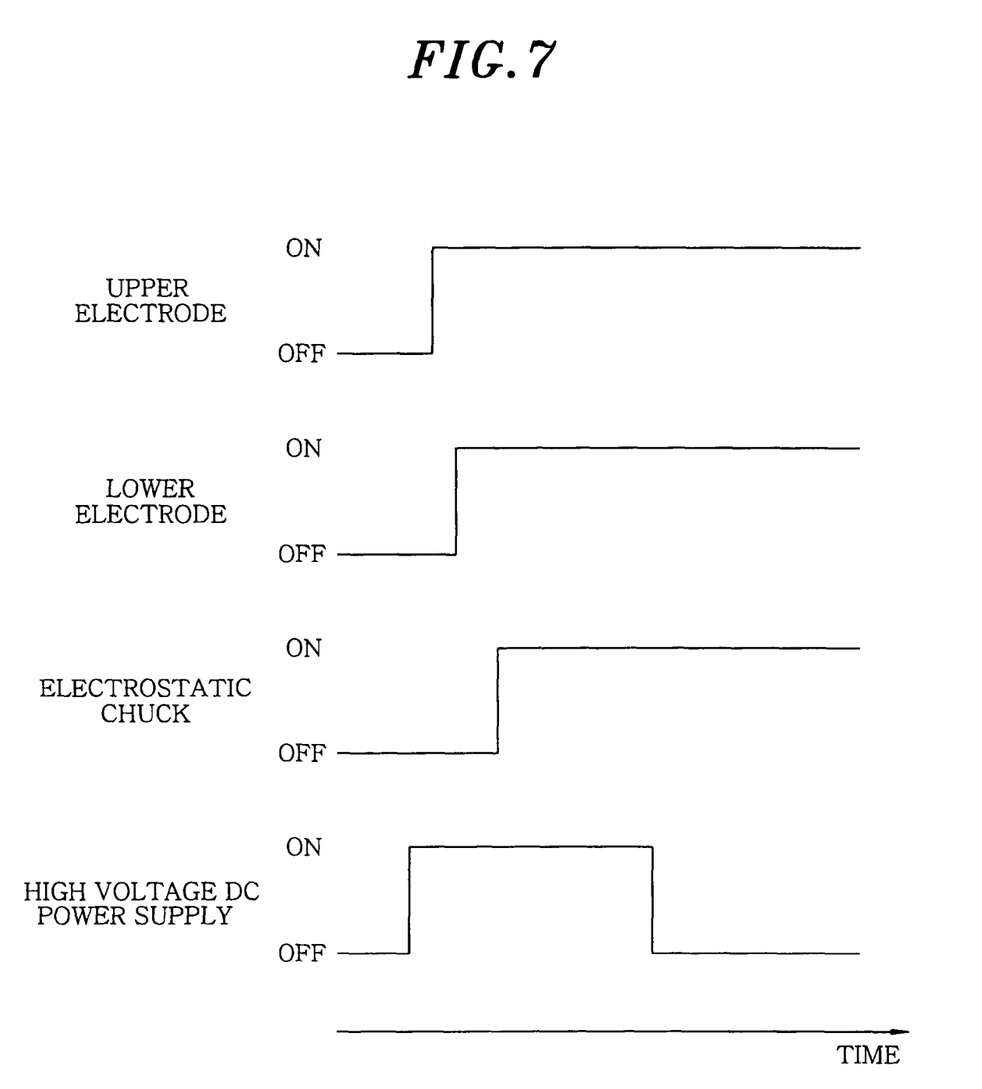
FIG. 7 describes an operational state of the plasma processing apparatus shown in FIG. 5.

As shown in FIG. 7, a high DC voltage is supplied to the upper electrode 21 from the high voltage DC power supply (HV-PS) 43.

Thereafter, by subsequently supplying high frequency power to the upper electrode 21 and the susceptor 5 (the lower electrode) from the first and the second high frequency power supply 40 and 50, respectively, plasma is ignited. The plasma ignition can be checked by the light detector 61 and the plasma detector 62 described above.

After the plasma is ignited, a high DC voltage from the DC power supply 13 to the electrostatic chuck 11 (electrode 12) is turned on, so that the wafer W is adsorbed to the electrostatic chuck 11.

Afterwards, the high DC voltage from the high voltage DC power supply (HV-PS) 43 to the upper electrode 21 is turned off. The reason to stop the high DC voltage application to the upper electrode 21 is to avoid adverse effects of the high DC voltage on the plasma etching of the wafer W to be performed thereafter. Thus, in case of a process where the application of the high DC voltage does not have any adverse effects, the high DC voltage need not be turned off.

By performing the plasma ignition in a state where the high DC voltage is applied to the upper electrode 21 from the high voltage DC power supply (HV-PS) 43 as described above, the plasma can be reliably ignited without adjusting the matching unit 41, even under a condition bf low pressure where the plasma ignition could not be readily achieved conventionally. For example, in case of employing an HBr single gas as an etching gas, it was difficult to conventionally carry out the plasma ignition at a gas pressure of 0.67 Pa (5 mTorr) or less. However, in the above-described method in accordance with the present invention, the plasma ignition can be reliably carried out even at a gas pressure of 0.67 Pa (5 mTorr), 0.40 Pa (3 mTorr) and 0.27 Pa (2 mTorr).

Further, even in case the etching gas is one other than the HBr single gas, e.g., a mixture gas containing HBr gas, a $NF_3$ single gas or a mixture gas containing $NF_3$ gas, the plasma can be ignited reliably. Further, the plasma ignition method of the present invention is applicable to any types of gases besides those mentioned above, even including gases by which plasma ignition has been conventionally difficult to achieve.

Furthermore, since the wafer W is not adsorbed by the electrostatic chuck 11 before the plasma is ignited, dust within the vacuum chamber 2 can be prevented from being collected on the wafer W before the plasma ignition. Further, since the dust within the vacuum chamber 2 is attracted by the plasma and exhausted by a flow of the process gas after the plasma ignition, it is very unlikely that the dust is collected on the wafer W. Such a plasma ignition method is advantageous for a case where the plasma ignition cannot be readily achieved. In a case where the plasma ignition is readily accomplished, a conventional plasma ignition method can be employed.

By using the plasma ignited as described above, the main etching of the silicon-containing conductive film layer 103 of the wafer W is conducted and, when the wafer W reaches an aforementioned state shown in FIG. 1B, the main etching process is ended. The timing for terminating, the main etching is detected by the apparatus configured as shown in FIG. 4.

Thereafter, the overetching process is carried by changing an etching condition. The overetching process is executed by employing an overetching gas which does not contain $Cl_2$, e.g., a mixture gas of HBr and $O_2$ or an HBr single gas, at a pressure definitely higher than that in the main etching process.

If required, the overetching process can be divided into the first overetching process and the second overetching process.

In such a case, it is preferable that the second overetching process is conducted under a high selectivity condition yielding an infinite selectivity, preferably at a pressure between 13 Pa and 27 Pa inclusive. Further, the first overetching process conducted before the second overetching process is preferably carried out at a pressure between those in the main etching process and the second overetching process, e.g., at a pressure between about 6.7 Pa and about 27 Pa.

Further, in case the overetching process is conducted in a single process, it is preferable that the single overetching process is executed at the same condition as that in the second overetching process described above.

In the preferred embodiment, the main etching process, the first and the second overetching process were performed under the following conditions:
  Main Etching Process
  an etching gas: $Cl_2$ (a flow rate of 50 sccm)+HBr (a flow rate of 350 sccm)
  A chamber pressure: 6.7 Pa
  a high frequency power applied to the upper electrode: 700 W
  a high frequency power applied to the lower electrode: 150 W
  a distance between the electrodes: 170 mm
  a pressure of He backgas: 399 Pa
  First Overetching Process
  an etching gas: HBr (a flow rate of 150 sccm)
  a chamber pressure: 8 Pa
  a high frequency power applied to the upper electrode: 150 W
  a high frequency power applied to the lower electrode: 20 W
  a distance between the electrodes: 90 mm
  a pressure of He backgas: 1330 Pa
  Second Overetching Process
  an etching gas: HBr (a flow rate of 200 sccm)
  a chamber pressure: 27 Pa
  a high frequency power applied to the upper electrode: 700 W
  a high frequency power applied to the lower electrode: 40 W
  a distance between the electrodes: 150 mm
  a pressure of He backgas: 1330 Pa An etching rate, an intra-wafer uniformity of the etching rate and a selectivity in each etching process are as follows:
  Main Etching Process
  an etching rate: 217.7 nm/min
  an in-surface uniformity: ±5%
  a selectivity: 17.5
  First Overetching Process
  an etching rate: 88.3 nm/min
  an in-surface uniformity: ±7.3%
  a selectivity: 452
  Second Overetching Process
  an etching rate: 75.7 nm/min
  an in-surface uniformity: ±10.5%
  a selectivity: ∞

The conversion transfer of the main etching process to the first overetching process was carried out before the silicon oxide film layer serving as the base layer was exposed to prevent the silicon oxide film layer from being etched and the conversion from the first to the second overetching process was conducted at a timing just before the silicon oxide film layer starts to be exposed (just prior to the appearance of the slope of the curve A shown in FIG. 3).

If the chamber pressure is increased to increase the selectivity while switching from the first overetching process to the second overetching process, the in-surface uniformity of the etching rate is reduced. In such a case, the in-surface uniformity of the etching rate can be improved by increasing the high frequency powers applied to the upper and the lower electrode and widening the distance between the electrodes.

In accordance with the preferred embodiment as described above, the silicon-containing oxide film layer could be removed by etching without causing any damages on the silicon oxide film layer serving as the base layer and without degrading the etched shape of the silicon-containing conductive film layer.

Though the overetching process is divided into the first and the second overetching process in the preferred embodiment, these two processes may be performed as one single overetching process.

Etching processes were conducted by using the etching apparatus as described earlier under the following conditions while varying a flow rate of oxygen in the etching gas to be 1, 3, 5 sccm, respectively.
  an etching gas: HBr (a flow rate of 100 sccm)+$O_2$ (flow rates of 1, 3, 5 sccm)
  A chamber pressure: 40 Pa
  a high frequency power applied to the upper electrode: 250 W
  a high frequency power applied to the lower electrode: 100 W
  a distance between the electrodes: 80 mm
  a pressure of He backgas: 1330 Pa
  Etching results are as follows:
  Oxygen Flow Rate of 1 sccm
  an etching rate: 159.8 nm/min
  an in-surface uniformity: ±5.4%
  a selectivity: 10
  Oxygen Flow Rate of 3 sccm
  an etching rate: 165.3 nm/min
  an in-surface uniformity: ±5.4%
  a selectivity: 104
  Oxygen Flow Rate of 5 sccm
  an etching rate: 167.2 nm/min
  an in-surface uniformity: ±5.7%
  a selectivity: 139

As can be seen from the above experimental results, though the inner pressure of the chamber is low, the selectivity can be raised by increasing the amount of oxygen added while maintaining the etching rate and the in-surface uniformity. Herein, if the amount of oxygen added exceeds 15%, deposition is likely to readily occur. Therefore, the amount of the oxygen added is preferably set to be about 1 to 5%, more preferably, 3 to 5%. As seen from the above, the selectivity can be increased by adjusting the amount of oxygen added.

Further, although the preferred embodiment has been described for the case of employing the parallel plate type etching apparatus for supplying high frequency powers to both of the upper electrode and the lower electrode, the present invention is not limited to the etching apparatus of this type. That is, the present invention can be applied to any type of plasma etching apparatuses, for example, an etching apparatus for supplying a high frequency power to either one of the upper and the lower electrode, an etching, apparatus for controlling the plasma by using a magnetic field, and so on.

As described above, the dry etching method in accordance with the present invention improves the selectivity of the silicon-containing conductive film layer against the silicon oxide film compared to conventional cases. Thus, without etching the silicon oxide film layer, i.e., a base layer, and without spoiling the etched shape of the silicon-containing conductive film layer, only the desired portions of the silicon-containing conductive film layer can be reliably removed.

Further, in recent plasma processing, the pressure of a process gas within a vacuum chamber tends to be set low in order to perform a high precision plasma processing for the purpose of keeping up with a recent trend for further miniaturized circuit patterns in semiconductor devices, and the like. As a result, plasma ignition gets more difficult to achieve.

Moreover, conventionally, a high frequency power to an electrode is applied via a matching unit for obtaining an impedance matching. Specifically, the matching unit achieves a matching (impedance matching) by varying a capacitance of a variable capacitor.

In an environment where plasma ignition is difficult, the success thereof depends on an initial state of the matching unit. That is, if the capacitance of the variable capacitor is not set to a value adequate for supplying a power to the electrode, the plasma ignition cannot be achieved.

Therefore, in case plasma ignition is difficult to achieve, it is required to adjust the state of the matching unit to facilitate the plasma ignition by fine tuning the capacitance of the variable capacitor. However, if the pressure of the process gas is further reduced, plasma cannot be ignited regardless of the state of the matching unit.

Further, in order to cope with the depressurization, there is employed a method where high frequency powers of different frequencies are applied to the upper electrode and the lower electrode, respectively, and a frequency of the high frequency power applied to the upper electrode is set to range, e.g., from 50 to 80 MHz, higher than in a conventional case, to serve as a plasma generating high frequency power. However, plasma ignition may not be fully secured even by employing this method.

The failure of plasma ignition occurs more frequently when using some specific process gases than others. For example, in case an HBr single gas is employed as a process gas and its pressure is low, e.g., 0.67 PA (5 mTorr) or less, plasma ignition cannot be achieved even though the above-described method using high frequency powers of different frequencies for the upper and the lower electrode is adopted.

On the other hand, if plasma ignition is carried out in a state where a substrate to be processed is electrostatically adhered to the electrostatic chuck on the lower electrode by applying a DC voltage thereto before plasma ignition, the plasma is likely to be more easily ignited.

It is conjectured that an electric field generated by the DC voltage of the electrostatic chuck functions to activate the process gas to thereby facilitate the plasma ignition in case where the electrostatic chuck adsorbs the substrate to be processed by applying the DC voltage thereto.

However, if the substrate to be processed is made to be adsorbed by the electrostatic chuck by applying the DC voltage thereto before the plasma ignition, dust may be easily collected on the substrate due to a static electricity, resulting in a source of defective generation and deteriorating a production yield.

The plasma ignition method in accordance with the present invention is advantageous in cases where plasma ignition is difficult to achieve as described above.

INDUSTRIAL APPLICABILITY

The dry etching method in accordance with the present invention can be employed in the field of a semiconductor manufacture for producing semiconductor devices. Thus, it has an industrial applicability.

What is claimed is:

1. A plasma processing method for use in a plasma processing apparatus, which includes a vacuum chamber for accommodating a substrate to be processed therein to perform a plasma processing thereon; an electrode provided in the vacuum chamber; a first high frequency power supply for supplying a first high frequency power to the electrode; a DC power supply for supplying a DC voltage to the electrode, the method comprising:
    starting supplying the DC voltage from the DC power supply to the electrode; and
    then, starting supplying the first high frequency power from the first high frequency power supply to the electrode.

2. The plasma processing method of claim 1, wherein the electrode is an upper electrode provided in an upper portion of the vacuum chamber.

3. The plasma processing method of claim 2, wherein the plasma processing apparatus further includes a lower electrode on which the substrate is mounted; and a second high frequency power supply for supplying a second high frequency power to the lower electrode, and
    the method further comprising:
    starting supplying the second high frequency power from the second high frequency power supply to the lower electrode after the starting supplying the DC voltage from the DC power supply to the upper electrode.

4. The plasma processing method of claim 3, wherein the lower electrode includes an electrostatic chuck to which the substrate is electrostatically adhered; and
    the method further comprising:
    supplying another DC voltage to the electrostatic chuck after the starting supplying the first high frequency power from the first high frequency power supply to the electrode.

5. The plasma processing method of claim 3, further comprising: the starting supplying the second high frequency power is performed after the starting supplying the first high frequency power.

6. The plasma processing method of claim 5, wherein the lower electrode of the plasma processing apparatus includes an electrostatic chuck to which the substrate to be processed is electrostatically adhered; and
    the method further comprising:
    supplying another DC voltage to the electrostatic chuck after the starting supplying the second high frequency power is performed.

7. A plasma processing method for use in a plasma processing apparatus, which includes a vacuum chamber for accommodating a substrate to be processed therein to perform a plasma processing thereon; a lower electrode, provided in the vacuum chamber, on which the substrate is mounted; an upper electrode provided in the vacuum chamber to face the lower electrode; a first high frequency power supply for supplying a first high frequency power to the upper electrode; a second high frequency power supply for supplying a second high frequency power to the lower electrode; and a DC power supply supplying a DC voltage to the upper electrode, the method comprising:
　　starting supplying the DC voltage from the DC power supply to the upper electrode; and then,
　　starting supplying the first high frequency power from the first high frequency power supply to the upper electrode and supplying the second high frequency power from the second high frequency power supply to the lower electrode.

8. The plasma processing method of claim 7, wherein the lower electrode of the plasma processing apparatus includes an electrostatic chuck to which the substrate to be processed is electrostatically adhered; and
　　the method further comprising:
　　supplying another DC voltage to the electrostatic chuck after the starting supplying the first high frequency power and supplying the second high frequency power are performed.

9. The plasma processing method of claim 7, wherein the starting supplying the second high frequency power is performed after the starting supplying the first high frequency power.

10. The plasma processing method of claim 9, wherein the lower electrode of the plasma processing apparatus includes an electrostatic chuck to which the substrate to be processed is electrostatically adhered; and
　　the method further comprising:
　　supplying another DC voltage to the electrostatic chuck after the starting supplying the second high frequency power is performed.

11. A plasma processing method for use in a plasma processing apparatus, which includes a vacuum chamber for accommodating a substrate to be processed therein to perform a plasma processing thereon; a lower electrode, provided in the vacuum chamber, on which the substrate is mounted; an upper electrode provided in the vacuum chamber to face the lower electrode; a first high frequency power supply for supplying a first high frequency power to the upper electrode; a second high frequency power supply for supplying a second high frequency power to the lower electrode; and a DC power supply supplying a DC voltage to the upper electrode, the method comprising:
　　starting supplying the DC voltage from the DC power supply to the upper electrode; and
　　subsequently starting supplying the first high frequency power from the first high frequency power supply to the upper electrode and supplying the second high frequency power from the second high frequency power supply to the lower electrode, thereby reliably igniting a plasma in the vacuum chamber.

12. The plasma processing method of claim 11, wherein the plasma processing is carried out at a pressure lower than 0.67 Pa by the plasma of an etching gas including an HBr gas or a $NF_3$ gas.

13. The plasma processing method of claim 11, wherein the starting supplying the second high frequency power is performed after the starting supplying the first high frequency power.

14. The plasma processing method of claim 11, wherein the lower electrode of the plasma processing apparatus includes an electrostatic chuck to which the substrate to be processed is electrostatically adhered; and
　　the method further comprising:
　　supplying another DC voltage to the electrostatic chuck after the starting supplying the first high frequency power and supplying the second high frequency power are performed.

15. The plasma processing method of claim 13, wherein the lower electrode of the plasma processing apparatus includes an electrostatic chuck to which the substrate to be processed is electrostatically adhered; and
　　the method further comprising:
　　supplying another DC voltage to the electrostatic chuck after the starting supplying the second high frequency power is performed.

* * * * *